United States Patent [19]

Leroux

[11] Patent Number: 5,407,785
[45] Date of Patent: Apr. 18, 1995

[54] METHOD FOR GENERATING DENSE LINES ON A SEMICONDUCTOR WAFER USING PHASE-SHIFTING AND MULTIPLE EXPOSURES

[75] Inventor: Pierre Leroux, San Antonio, Tex.

[73] Assignee: VLSI Technology, Inc., San Jose, Calif.

[21] Appl. No.: 993,228

[22] Filed: Dec. 18, 1992

[51] Int. Cl.$^6$ ............................ G03F 7/22; G03C 5/00
[52] U.S. Cl. .................................. 430/312; 430/328; 430/394; 430/396; 430/397
[58] Field of Search ............... 430/312, 328, 394, 396, 430/397

[56] References Cited

U.S. PATENT DOCUMENTS

| | | | |
|---|---|---|---|
| 4,021,239 | 5/1977 | Ogawa | 430/397 |
| 4,315,984 | 2/1982 | Okazaki | 430/312 |
| 5,275,896 | 1/1994 | Garofalo | 430/312 |

OTHER PUBLICATIONS

Burggraaf, Pieter, "Four More Significant Japanese Advances in Phase Shifting Technology", Semiconductor International, Dec. 1991.

*Primary Examiner*—Kathleen Duda
*Attorney, Agent, or Firm*—Burns, Doane, Swecker & Mathis

[57] ABSTRACT

Ultra-small equal-width lines and spaces are generated on an integrated circuit wafer using multiple exposures and phase-shifting at the wafer level. In particular, an integrated circuit wafer is coated with a layer of photoresist and then masked using a mask defining a pattern of multiple feature lines arranged at a regular line pitch. The layer of photoresist is then underexposed so as to partially bleach portions of the layer of photoresist in accordance with the pattern. Next, the mask and the integrated circuit wafer are positionally translated relative to one another by a predetermined fraction of the line pitch, and the layer of photoresist is then again underexposed. Developing the photoresist layer creates a stepped profile. The layer of photoresist is then blanket exposed, the stepped profile causing exposure in the vicinity of steps to be retarded. The layer of photoresist is then developed, producing thin lines of photoresist separated by substantially equal spaces of no photoresist.

1 Claim, 2 Drawing Sheets

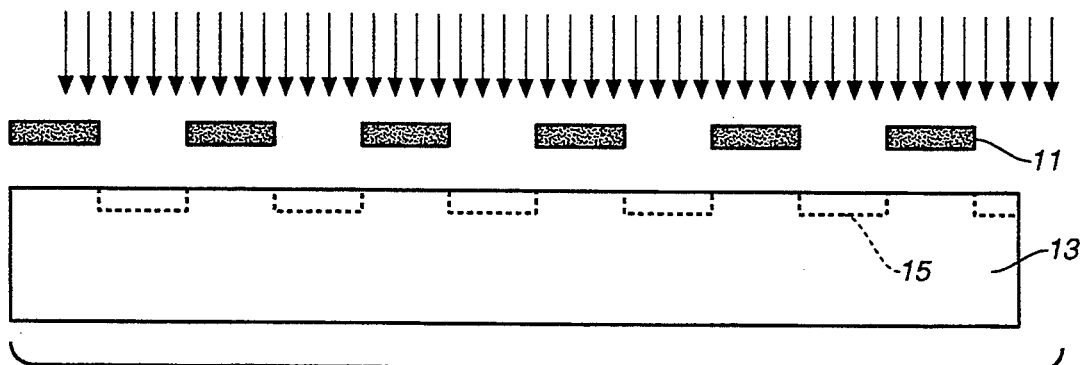
FIG._1
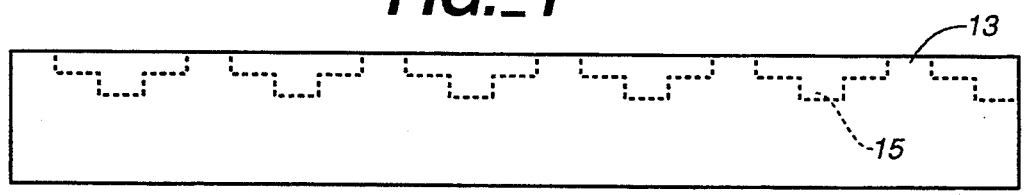
FIG._2 WAFER SHIFT
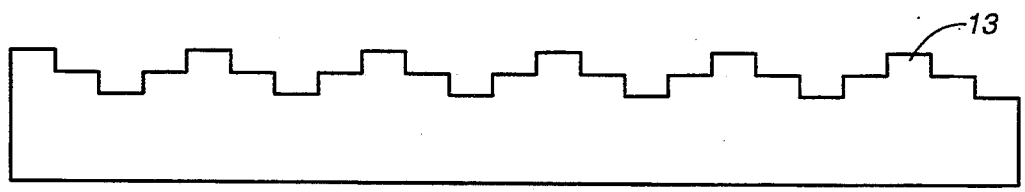
FIG._3
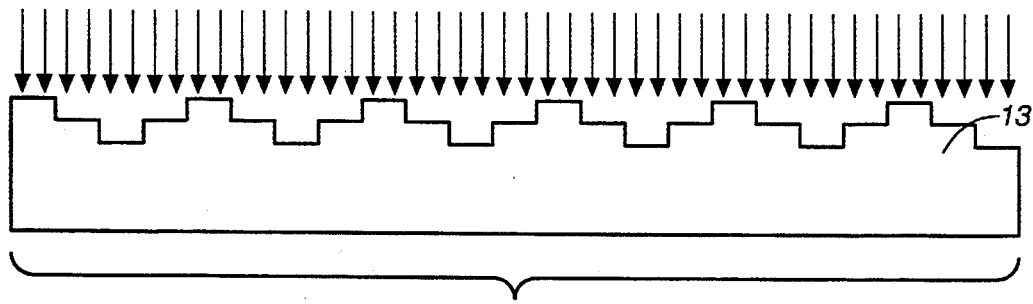
FIG._4
FIG._5

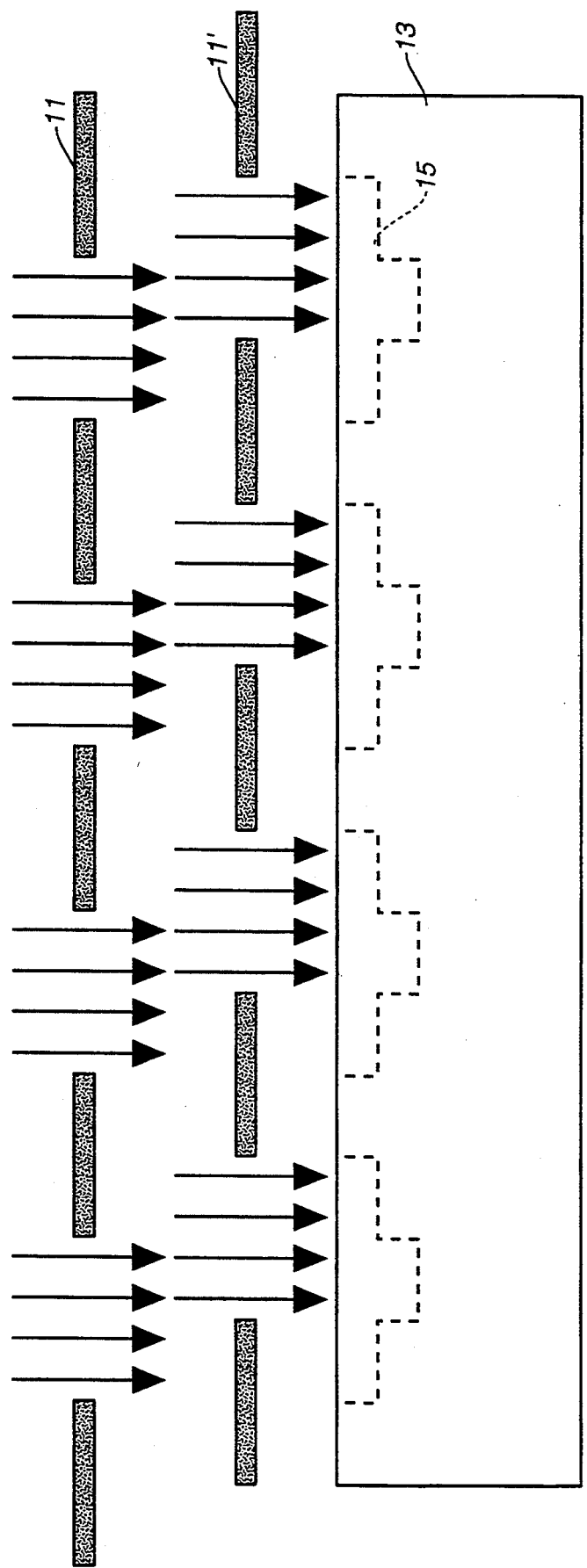

METHOD FOR GENERATING DENSE LINES ON A SEMICONDUCTOR WAFER USING PHASE-SHIFTING AND MULTIPLE EXPOSURES

BACKGROUND OF THE INVENTION

1. Field of the Invention

The present invention relates to integrated circuit fabrication and more particularly to methods for generating dense lines on a surface of a semiconductor wafer.

2. State of the Art

In recent years, dramatic progress has been made toward increasing the density of integrated circuits. In the area of gate arrays, for example, whereas only recently gate arrays offered about 10K to 20K usable gates, advanced gate arrays now offer upwards of 250K raw gates and 100K usable gates. In the area of semiconductor memories, 64 Mb DRAMs are presently available and 256 Mb DRAMs are on the horizon. Device line-widths have decreased from 1 um to 0.5 um and even smaller using specialized equipment. Typically, minimum resolution with a G-line stepper is about 0.6 um to 0.8 um. Such steppers cost approximately from 1 to 1.5 million dollars. Using an I-line stepper, minimum resolution is about 0.35 um to 0.45 um. The cost of an I-line stepper is about 2 to 2.5 million dollars. Eximer laser steppers offer a minimum resolution of about 0.25 um at a cost of about 3 million dollars.

Despite the foregoing advances, serious obstacles remain to achieving further increases in integration density. Unconventional lithographic methods such as E-beam and X-ray lithography face serious challenges. In conventional lithography using photoresists, an unavoidable tradeoff has been between keeping resist layers sufficiently thin to achieve good resolution while at the same time achieving step coverage, and leaving sufficient resist thickness to satisfy the requirements of etching processes that may exhibit only low to moderate selectivity. For example, factory specifications of a I-line stepper might specify a resolution of 0.38 um. The depth of focus of the machine, however, will typically be no more than 1 um. To achieve step coverage and satisfy the requirements of an etching process that does not exhibit extremely high selectivity, a resist layer may have to be 1.5 um thick, with the result that the specified resolution of 0.38 um cannot be achieved.

The invention allows this tradeoff between depth of focus on the one hand and step coverage/selectivity on the other hand to be avoided. The invention provides a method of generating equal lines and spaces of as small as 0.2 um using conventional G-line steppers having a small numerical aperture (approximately 0.43) at a cost of 1 million dollars or less.

Sharp Electronics has developed a phase-shifting wafer exposure technique using conventional masks. Using this technique, referred to as phase-shifting on the substrate (POST), extremely small lines on the order of 0.2 um or less may be achieved. The spaces using that technique are much bigger, however, than the lines. Two examples cited in *Semiconductor International*, December 1991, page 16, refer to 0.15 um lines with a 0.5 um pitch and 0.2 um lines with 0.9 um pitch. According to the described technique, although line-widths can be made very small, density remains limited by the relatively large spaces between lines. The present method eliminates the problem of larger spaces, achieving higher density by generating equal-width lines and spaces.

SUMMARY OF THE INVENTION

The present invention, generally speaking, provides a method to generate ultra-small equal-width lines and spaces using multiple exposures and phase-shifting at the wafer level. In particular, an integrated circuit wafer is coated with a layer of photoresist and then masked using a mask defining a pattern of multiple feature lines arranged at a regular line pitch. The layer of photoresist is then underexposed so as to partially bleach portions of the layer of photoresist in accordance with the pattern. Next, the mask and the integrated circuit wafer are positionally translated relative to one another by a predetermined fraction of the line pitch, and the layer of photoresist is then again underexposed. Developing the photoresist layer creates a stepped profile. The layer of photoresist is then blanket exposed, the stepped profile causing exposure in the vicinity of steps to be retarded. The layer of photoresist is then developed, producing thin lines of photoresist separated by substantially equal spaces of no photoresist.

BRIEF DESCRIPTION OF THE DRAWINGS

The present invention can be further understood with reference to the following description in conjunction with the appended drawings. In the drawings:

FIG. 1 is a diagram of a first partial-bleaching exposure step;

FIG. 2 is a diagram of a bleaching patterning resulting from a second partial-bleaching exposure step performed with the wafer shifted;

FIG. 3 is a diagram of a surface profile resulting from development of the wafer in FIG. 2;

FIG. 4 is a diagram of a blanket exposure step;

FIG. 5 is a diagram showing thin resist lines separated by substantially equal spaces produced by developing the wafer of FIG. 4; and FIG. 6 is a more detailed representation of the combined effect of the first and second partial-bleaching exposures.

DETAILED DESCRIPTION OF THE PREFERRED EMBODIMENT

The present method uses conventional masks and a conventional G-line stepper in conjunction with multiple exposures and phase-shifting to generate equal lines and spaces as small as about 0.2 um.

Referring to FIG. 1, a wafer (not shown) coated with a layer of photoresist 13 is exposed with ultraviolet light through a conventional mask defining a pattern of lines arranged at a regular line pitch. The photoresist layer is underexposed so as to only partially bleached the photoresist. For example, if an exposure energy of 50 mJ were required to totally expose the photoresist layer, the photoresist layer might instead be exposed with an energy of 5 mJ so as to bleach only a small top-most layer of the photoresist, for example the top-most 1000 Å of a photoresist layer about 13,000 Å thick. The partially bleached photoresist regions 15 are indicated in FIG. 1 and subsequent figures by dashed outlined regions. The exposure illustrated in FIG. 1 is the first of multiple partial-bleaching exposures.

In preparation for a second partial-bleaching exposure, the mask and the integrated circuit wafer are positionally translated relative to one another by a predetermined fraction of the line pitch. In a preferred embodiment, the wafer is shifted by an amount gauged according to a pre-existing mark on the wafer. For example, if the line pitch were 1.6 um, the wafer might be shifted by ¼th the line pitch, or 0.4 um. The wafer is then once again underexposed, producing partially bleached regions 15 as illustrated in FIG. 2. At 0.4 um, intervals, the photoresist layer goes from unexposed, to once underexposed, to twice underexposed, to once underexposed and back to unexposed.

The manner in which the partially-bleached regions of FIG. 2 are produced may be seen more clearly with reference to FIG. 6. For explanatory purposes the positional translation between the mask and the wafer is assumed to be accomplished by shifting the mask. The mask is shown at the same time in its unshifted (11) and shifted (11') positions. Light transmitted through the mask in each of the position is represented by arrows extending through the transmissive portions of the mask. When the mask and the integrated circuit wafer are positionally translated (represented in this instance by shifting of the mask) by one quarter of the line pitch, the transmissive portions of the mask in the two positions overlap by the same amount. The underlying region of the wafer is therefore underexposed twice, once by light through the mask in its first portion and again by light through the mask in its second portion. Regions adjoining on either side are underexposed only once, one of the regions by light through the mask in its first position and another of the regions by light through the mask in its second position. Regions adjoining the once underexposed regions remain unexposed, the opaque regions of the mask in its first and second positions overlapping. Although in a preferred embodiment the wafer is shifted, rather the mask, the effect is the same.

Referring now to FIG. 3, when the partially bleached wafer of FIG. 2 is developed, a stair-step pattern is produced in the photoresist layer in an alternating pattern of two steps down, two steps up, two steps down, etc. Each of the steps is used to produce a thin line of resist underneath the step as shown in FIGS. 4 and 5. The stair-step patterned photoresist layer is first blanket exposed as shown in FIG. 4. During blanket exposure, the stepped profile of the photoresist layer causes exposure in the vicinity of surface steps to be retarded. Development of the photoresist then produces thin lines of resist underlying the steps as shown in FIG. 5.

One explanation of the mechanism illustrated in FIGS. 4 and 5 is that the photoresist steps act as phase shifters, producing light intensity nulls at the locations of the steps. In accordance with this explanation, the height of the steps should be controlled so as to create a destructive interference condition. Experiments indicate, however, that the height of the step is not critical so long as a distinct step does exist. The mechanism by which the resist pattern is created may therefore be more of a shadowing mechanism than a phase shifting mechanism.

More than one shift may be used with more than two partial exposures. For example, a mask having 0.9 um lines and spaces may be used to generate 0.3 um lines and spaces by performing a first underexposure, shifting the wafer a first time by 1/6th of the pitch and performing a second underexposure, and shifting the wafer a second time by 1/6th of the pitch and performing a third underexposure. As many shifts as desired may be used to realize very fine lines and spaces.

The method may be used to particular advantage in patterning the gate layer of gate arrays in which the pattern lines run predominantly in a single direction.

Example

A wafer was prepared by a vacuum bake vapor prime procedure using HMDS primer. The wafer was then spin coated with a layer of TOK 8900 S32 photoresist and soft baked at 90° C. to yield a photoresist layer about 1.315 um thick. The wafer was then underexposed with an exposure energy of approximately 20 mJ using a Canon Mark II G-line stepper having a numerical aperture of approximately 0.43 and a Canon mask having 0.8 um lines and spaces. The wafer was then shifted in the transverse direction by 0.4 um, and the wafer was again underexposed with an exposure energy of about 20 mJ. The photoresist layer was then developed in a doublepuddle develop process using TOK developer. The wafer was then blanket exposed with an exposure energy of about 40 mJ, followed by a post exposure bake at 120° C. The photoresist layer was then developed again using the doublepuddle process, and the wafer was examined using a scanning electron microscope. Fine lines and spaces of about 0.4 um were observed. The scanning electron micrograph further indicated that the resist lines were relatively thick with a relatively steep sidewall angle so as to be more than adequate for patterning the gate layer of a gate array. Similar trials obtained resist lines as small as 0.18 um.

Using the described method, depth of focus, usually a cause of great concern, becomes virtually irrelevant. Even if a thick resist layer is used, only a thin layer at the top of the resist is actually patterned. That is, the pattern is essentially printed on top of the photoresist layer, and the bulk of the resist layer is then patterned using the described POST technique.

The foregoing has described the principles, preferred embodiments, and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the invention as defined by the following claims.

What is claimed is:

1. A method of producing feature lines in a layer of photoresist on an integrated circuit wafer, comprising the steps of:

coating the integrated circuit wafer with a layer of photoresist;

masking the photoresist layer using a mask defining a pattern of multiple features lines arranged at a regular line pitch;

through said mask, under-exposing the layer of photoresist so as to partially bleach portions of the layer of photoresist in accordance with said pattern;

positionally translating the mask and integrated circuit wafer relative to one another, in a direction in which the line pitch is measured, by a pre-determined fraction of the line pitch;

again under-exposing the layer of photoresist through said mask;

developing the layer of photoresist, creating a stepped profile;

blanket exposing the layer of photoresist; and developing the layer of photoresist.

* * * * *